(12) United States Patent
Hyodo et al.

(10) Patent No.: US 6,974,642 B2
(45) Date of Patent: Dec. 13, 2005

(54) CARBONACEOUS PROTECTIVE LAYER, MAGNETIC RECORDING MEDIUM, PRODUCTION METHOD THEREOF, AND MAGNETIC DISK APPARATUS

(75) Inventors: Hiroyuki Hyodo, Kawasaki (JP); Takayuki Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/849,966

(22) Filed: May 4, 2001

(65) Prior Publication Data

US 2001/0029051 A1    Oct. 11, 2001

(30) Foreign Application Priority Data

May 10, 2000 (JP) .............................. 2000-137571

(51) Int. Cl.[7] ................................................ G11B 5/72
(52) U.S. Cl. ................... 428/835.4; 428/848.8
(58) Field of Search ...................... 428/408, 694 TC (56) References Cited

U.S. PATENT DOCUMENTS

| | | | | |
|---|---|---|---|---|
| 5,543,203 A | * | 8/1996 | Tani et al. ................... | 428/156 |
| 5,858,477 A | * | 1/1999 | Veerasamy et al. ......... | 427/562 |
| 6,303,225 B1 | * | 10/2001 | Veerasamy ................... | 428/408 |
| 6,403,194 B1 | * | 6/2002 | Ono et al. ................... | 428/65.5 |

FOREIGN PATENT DOCUMENTS

| | | |
|---|---|---|
| JP | 7296372 A | 11/1995 |
| JP | 8212533 A | 8/1996 |
| JP | 10143836 A | 5/1998 |
| JP | 11316942 A | 11/1999 |
| JP | 2000067428 A | 3/2000 |

* cited by examiner

*Primary Examiner*—Stevan A. Resan
(74) *Attorney, Agent, or Firm*—Greer, Burns & Crain, Ltd.

(57) ABSTRACT

A carbonaceous protective layer particularly suitable for use in magnetic recording media. The carbonaceous protective layer is formed by a Filtered Cathodic Arc process, and contains nitrogen distributed therein. A process for the production of a carbonaceous protective layer as well as a magnetic recording medium and a magnetic disk apparatus are also disclosed.

12 Claims, 6 Drawing Sheets

CARBONACEOUS PROTECTIVE LAYER, MAGNETIC RECORDING MEDIUM, PRODUCTION METHOD THEREOF, AND MAGNETIC DISK APPARATUS

BACKGROUND OF THE INVENTION

1. Field of the Invention

The present invention relates to a carbonaceous protective layer, a magnetic recording medium used in a hard disk device of a computer, their production methods, and a magnetic disk device or apparatus using the magnetic recording medium. More particularly, the present invention relates to a carbonaceous protective layer for protecting a magnetic recording layer of a magnetic recording medium, etc, and a production method of the carbonaceous protective layer.

2. Description of the Related Art

In an information processing unit such as a computer, a magnetic disk apparatus has been widely used as an external storage device. When the magnetic disk apparatus is used, information can be recorded on and read from the magnetic recording medium as a magnetic head scans the magnetic recording medium (magnetic disk). Various improvements have been made in both the magnetic recording medium and the magnetic head in order to satisfy recent high-level needs such as high-density recording and recording and reproduction with high sensitivity and at a high speed.

As is well-known, a conventional magnetic recording medium comprises a non-magnetic substrate having applied thereon, in sequence, an underlayer, a magnetic recording layer (also called as a "magnetic layer"), a protective layer and a lubricant layer. The substrate comprises an aluminum substrate, for example, which has a NiP-plated surface. This surface is super-finished. Super-finishing smoothes the surface of the substrate. The underlayer is generally made of a Cr-based alloy as a non-magnetic metal. The Cr-based alloy is a CrMo-based alloy, for example. The magnetic recording layer is generally made of a CoCr-based alloy as a ferromagnetic metal. The CoCr-based alloy is CoCrTa, CoCrPt or CoCrPtTaNb, for example. The protective layer is deposited to the magnetic recording layer to protect the magnetic recording layer from damage resulting from impact with the magnetic head. The protective layer is made of various carbon materials such as amorphous carbon. The protective layer is generally called a "carbonaceous protective layer". The carbonaceous protective layer is impregnated with a liquid lubricant such as a fluorocarbon-based liquid lubricant to form the lubricant layer that insures smooth flying of the head above the magnetic recording medium.

In the magnetic recording medium according to the prior art, the carbonaceous protective layer has been formed by sputtering, chemical vapor deposition (hereinafter referred to as "CVD"), etc, that are conventional film-forming technologies in the production of semiconductor devices. To impart improved durability to the carbonaceous protective layer so formed, hydrogen and nitrogen are often added to the carbonaceous protective layer. For example, Japanese Unexamined Patent Publication (Kokai) No. 7-296372 discloses a magnetic recording medium formed by serially laminating a magnetic layer, a carbonaceous protective layer and a lubricant layer on a non-magnetic substrate. In this magnetic recording medium, the surface of the carbonaceous protective layer is plasma-treated in an ammonia gas-containing atmosphere and then a lubricant layer is formed by using a lubricant containing a lubricant molecule having a carboxyl group at one of the terminals. In this magnetic recording medium, the carbonaceous protective layer is a carbon layer or a hydrogenated carbon layer, and is formed by sputtering, plasma CVD or ion plating. The thickness of such a carbonaceous protective layer is generally 50 to 500 angstroms and preferably 100 to 300 angstroms.

A similar magnetic recording medium is also disclosed in Japanese Unexamined Patent Publication (Kokai) No. 10-143836. The magnetic recording medium described in this reference includes a ferromagnetic metal thin film formed on a non-magnetic substrate and a protective layer formed on the ferromagnetic metal thin film. The protective layer is a nitrogen-containing carbonaceous layer characterized in that a nitrogen concentration in the protective layer is varied in the thickness-wise direction of the protective layer, a nitrogen concentration of the layer on the substrate side is higher than that of the layer on the surface side, and a lubricant layer on the protective layer contains a polyphenoxycyclotriphosphazene lubricant in a weight ratio of 0.01 to 1.0 in addition to perfluoropolyether lubricant.

Though hydrogen and nitrogen are added to the carbonaceous protective layer of the conventional magnetic recording media to improve durability, these media cannot exhibit sufficiently high durability when the thickness is reduced in the protective layer. That is, although the hard disk apparatuses have rapidly become to have higher recording density, and thus the flying height of the head as well as the film thickness of the protective layer have been reduced, the carbonaceous protective layer, when formed with a small thickness, cannot is still insufficient to provide an improved durability. As a matter of fact, even when nitrogen is added to the carbonaceous protective layer formed by sputtering or CVD, so as to improve its durability, this durability can hardly be maintained in the case of a thin film having a layer thickness of 5 nm or less.

SUMMARY OF THE INVENTION

It is an object of the present invention to provide a carbonaceous protective layer suitable for a magnetic recording medium, that solves the prior art problems described above, exhibits excellent durability even when its layer thickness is 5 nm or less and yet can keep its durability for a long period.

Further, it is another object of the present invention to provide a carbonaceous protective layer capable of improving an adhesion to the lubricant layer, while preventing a reduction of the durability.

Furthermore, it is another object of the present invention to provide a magnetic recording medium having such a carbonaceous protective layer, and a production method of the same.

Moreover, it is still another object of the present invention to provide a magnetic disk apparatus that uses a magnetic recording medium having such a carbonaceous protective layer.

These and other objects of the present invention will be easily understood from the following detailed description of the preferred embodiments of the present invention.

The inventors of this application have conducted intensive studies for accomplishing the objects described above, and have discovered that the adsorbing, by a carbonaceous protective layer, of a liquid lubricant can be remarkably improved and the carbonaceous protective layer can acquire and maintain excellent durability when a carbonaceous protective layer having high hardness is deposited on a magnetic recording layer by employing a Filtered Cathodic Arc process (hereinafter referred to as the "FCA process"), in place of sputtering and CVD that have been widely used in the past for forming a carbonaceous protective layer, and also when nitrogen is introduced into this high hardness carbonaceous protective layer.

According to one aspect of the present invention, there is provided a carbonaceous protective layer, characterized by being formed, on an underlying material, by a Filtered Cathodic Arc process (FCA process), said protective layer containing nitrogen.

In the carbonaceous protective layer of the present invention, the concentration of the contained nitrogen in the thickness-wise direction of the layer may be uniform or, alternatively, it may be inclined so that the nitrogen concentration is gradually increased from a lower portion of the layer to an upper portion of the layer.

Further, in the incorporation of nitrogen into the carbonaceous protective layer, the protective layer may be constituted so that nitrogen is completely or substantially excluded from at least a lower half portion of the layer, i.e., at least a portion occupying half of the full thickness of the layer from its bottom (interface with the underlying layer).

According to another aspect of the present invention, there is provided a magnetic recording medium comprising a carbonaceous protective layer, for protecting a magnetic recording layer deposited on a non-magnetic substrate, wherein the carbonaceous protective layer is the layer according to the present invention, that is, the carbonaceous protective layer deposited by an FCA process, containing nitrogen.

According to still another aspect of the present invention, there is provided a method of producing a magnetic recording medium comprising a carbonaceous protective layer for protecting a magnetic recording layer deposited on a non-magnetic substrate, which method comprises the steps of depositing the carbonaceous protective layer by an FCA process, and incorporating nitrogen into the carbonaceous protective layer during deposition of the carbonaceous protective layer.

Further, according to still another aspect of the present invention, there is provided a magnetic disk apparatus comprising a recording head for recording information and a reproducing head for reproducing information, to and from a magnetic recording medium, wherein the magnetic recording medium is a magnetic recording medium comprising a carbonaceous protective layer for protecting a magnetic recording layer deposited on a non-magnetic substrate, and the carbonaceous protective layer is the layer of the present invention deposited by an FCA process.

The FCA process used as a film forming method in the present invention can form a high-hardness carbonaceous layer having a greater amount of diamond components than the films formed by sputtering and CVD as the conventional film forming methods of the carbonaceous protective layer. Unexpectedly, therefore, the carbonaceous layer formed by the FCA process according to the present invention can exhibit high durability even when the layer thickness is 5 nm or less.

Further, when a predetermined amount of nitrogen is introduced into the carbonaceous layer with the film forming method using preferably nitrogen ion beam assist or a nitrogen atmosphere, hardness of the layer and its adsorption of a liquid lubricant can be controlled. Consequently, the durability of the carbonaceous layer can be controlled and stably maintained. The content of the incorporated nitrogen is generally substantially uniform in the thickness-wise direction of the carbonaceous layer.

In addition, when nitrogen is added to the carbonaceous layer according to the present invention, if an amount of nitrogen added is inclined in the layer in such a manner that the amount is gradually increased from a lower portion of the layer to an upper portion of the layer, a reduction in the layer hardness, which may be caused due to addition of nitrogen, can be more effectively inhibited than with the uniform addition of nitrogen to the carbonaceous layer. Further, the inclined distribution of nitrogen in the carbonaceous layer does not adversely affect the increase of the adhesion between this layer and the lubricant layer which is obtained based on nitrogen addition. Furthermore, prevention of reduction in the layer durability and increase of an adhesion between the carbonaceous layer and the lubricant layer can be remarkably improved when nitrogen is selectively added to an upper portion of the carbonaceous layer, preferably an upper half portion of the same.

DESCRIPTION OF THE PREFERRED EMBODIMENTS

Figure 1:
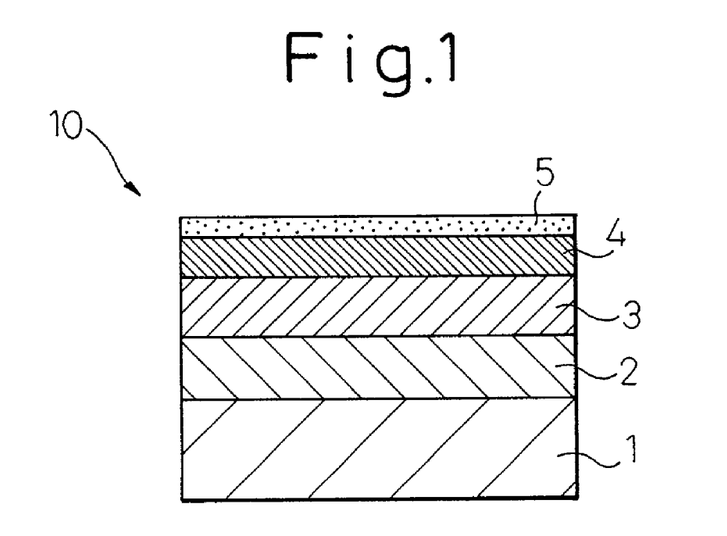
FIG. 1 is a cross-sectional view schematically showing a typical example of a magnetic recording medium according to the present invention.

The magnetic recording medium according to the present invention may have a layer structure similar to that of the well-known magnetic recording medium except for the differences in the carbonaceous protective layer. The magnetic recording medium according to the present invention will be explained by referring to the basic structure shown in FIG. 1. The magnetic recording medium 10 according to the present invention includes at least a non-magnetic substrate 1, an underlayer 2, a magnetic recording layer 3, a carbonaceous protective layer 4 and a lubricant layer 5. However, various changes or modifications can be made to the layer structure of the magnetic recording medium 10 within the scope of the present invention. For example, the magnetic recording layer 3 may have a multi-layered structure, or an intermediate layer(s) may be inserted. As a matter of fact, the layer structures of magnetic recording media used at present are extremely complicated.

In the magnetic recording medium according to the present invention, the non-magnetic substrate can be formed of various materials that are customarily used in this technical field. Examples of suitable non-magnetic substrates are a NiP-plated aluminum (inclusive of Al alloy) substrate, a glass or reinforced glass substrate, a silicon substrate having a surface oxide film such as a silicon oxide film, a SiC substrate, a carbon substrate, a plastic substrate and a ceramic substrate, though they are not particularly restrictive. Among them, the NiP-plated aluminum (inclusive of Al alloy) substrate can be used particularly advantageously.

The underlayer on the non-magnetic substrate can be formed of ordinary non-magnetic materials that are customarily used in the magnetic recording media, and can be preferably formed on a non-magnetic metal material containing chromium as the principal component. The underlayer may be a single layer, or may have a multi-layered structure of two or more layers. When the underlayer has the multi-layered structure, the composition of each layer can be changed arbitrarily. Such an underlayer can be formed of a metal material containing only chromium as the principal component, or a metal material containing chromium and molybdenum as the principal components. When the magnetic recording layer of the magnetic recording medium contains platinum, for example, the underlayer is preferably formed of the metal material containing chromium and molybdenum as the principal components. In other words, when added, molybdenum can expand the lattice planar gap. When the lattice planar gap of the underlayer is brought close to the lattice planar gap of the magnetic recording layer that is expanded by the composition of the magnetic recording layer, particularly by the addition amount of platinum, preferential orientation into the plane of the C axis of the magnetic recording layer (CoCr-based alloy) can be promoted. Examples of suitable materials of the underlayer include Cr, CrW, CrV, CrTi, CrMo, and so forth. The underlayer can be formed preferably by sputtering such as magnetron sputtering under a customary film formation condition. To improve the coercive force, sputtering is executed particularly under the application of a DC negative bias. A suitable film formation condition is a film formation temperature of about 100 to about 300° C., an Ar gas pressure of about 1 to about 10 mTorr, and a DC negative bias of about 100 to about 300 V. Other film formation methods such as vacuum deposition, ion beam sputtering, etc, may be used, whenever necessary, in place of sputtering. The film thickness of such an underlayer can be varied over a broad range depending on various factors. To improve an S/N ratio, the film thickness is generally within the range of 5 to 60 nm, though this value is not particularly limitative. When the film thickness of the underlayer is less than 5 nm, magnetic properties cannot be fully exploited and when it exceeds 60 nm, on the contrary, noise is likely to increase.

The magnetic recording medium according to the present invention may include an additional underlayer made of a metal material consisting of titanium as the principal component, preferably a Ti thin film, between the non-magnetic substrate and the underlayer on the substrate, whenever necessary. Such an intermediate layer has the function of improving bonding between the non-magnetic substrate and the underlayer.

In the magnetic recording medium according to the present invention, the magnetic recording layer to be formed on the non-magnetic underlayer may comprise an ordinary magnetic recording layer in a customary magnetic recording medium, in the same way as the underlayer. The magnetic recording layer may be a single layer or may have a multi-layered structure of two or more layers. When the magnetic recording layer has a multi-layered structure, the composition of the respective magnetic recording layers may be the same or different. An intermediate layer may be sandwiched between the magnetic recording layers, whenever necessary, to improve the magnetic recording characteristics.

When the magnetic recording layer has a single-layered structure, for example, the magnetic recording layer can be formed of a quinary alloy that contains cobalt as the principal component, and further contains:

chromium: 14 to 23 at %,
platinum: 1 to 20 at %, and
a combination of tungsten and carbon.

This magnetic recording layer can constitute an upper layer magnetic recording layer when the magnetic recording layer has a two-layered structure.

An explanation will be given more concretely. The quinary alloy of the magnetic recording layer or the upper layer magnetic recording layer having the two-layered structure preferably has the composition range expressed by the following formula:

$$Co_{bal}—Cr_{14-23}—Pt_{1-20}—W_x—C_y$$

where "bal" means a balance, and x+y is 1 to 7 at %.

In the magnetic recording medium according to the present invention, the magnetic recording is formed of the CoCrPt alloy, both W and C are added and furthermore, the layer structure and the film formation process are optimized. Consequently, the present invention can drastically reduce noise, can acquire a high S/N ratio and eventually, can provide a high-density recording medium.

According to observations by the present inventors, the remarkable effects described above can be obtained because W and C added to the CoCrPt alloy for forming the magnetic recording layer can form stable compounds of WC and $W_2C$. It is believed that since these compounds have an extremely low solid solution limit to Co, they precipitate at the crystal grain boundaries.

Since WC and $W_2C$ are not ferromagnetic materials, they cut off the magnetic bond of each magnetic particle and reduce noise when they precipitate at the crystal grain boundaries. However, the addition of C in an excessive amount makes the particle diameter of the magnetic layer finer and is likely to invite a drop in the coercive force Hc. Therefore, the carbon ratio in W:C must be smaller than 2. On the other hand, W of 1.5 on an average can be bonded with C of 1. The remaining tungsten enters a Co-rich region of the magnetic particles, makes the particles finer and contributes to low noise of the medium. When the tungsten ratio in W:C is greater than 5, the texture becomes finer and the coercive force Hc drops with the result that the medium noise increases and the signal output drops in a high-density recording region. When W is added in an excessive amount, the target is hardened, and machining becomes difficult. From these aspects, the ratio of the addition amounts of W and C is preferably within the range of 5:1 to 2:1 in the CoCrPtWC quinary alloy in the magnetic recording layer having a single layered-structure or in the upper layer magnetic recording layer. It is particularly preferred in such a quinary alloy that the ratio of the addition amounts of W and C is 4:1 and their sum is 1 to 7 at %.

When the magnetic recording layer of the magnetic recording medium has a two-layered structure, a magnetic recording layer made of the CoCrPtWC quinary alloy described above can be employed for the upper layer magnetic recording layer. The following layer can be used as the lower layer magnetic layer to be sandwiched between this upper layer magnetic recording layer and the underlayer. Namely, the lower layer magnetic recording layer is made of a quinary alloy that contains cobalt as the principal component, and chromium: 13 to 21 at %,
platinum: 1 to 20 at %, and
a combination of tantalum and niobium.

A concrete explanation will be given further. The quinary alloy of this lower layer magnetic recording layer preferably has a composition within the range expressed by the following formula:

$$Co_{bal}\text{—}Cr_{13\text{-}21}\text{—}Pt_{1\text{-}20}\text{—}Ta_x\text{—}Nb_y$$

where "bal" means a balance and x+y is 1 to 7 at %. In this case, the addition amounts of tantalum and niobium are preferably equal, or substantially equal, to each other, and their sum is preferably 1 to 7 at % in the quinary alloy of the lower layer magnetic recording layer. Assuming, for example, that this lower layer magnetic recording layer is formed by using a magnetron film sputtering apparatus at a film formation temperature of not lower than 200° C. and by applying a bias voltage of −80 to −400 V, a $Co_{74}Cr_{17}Pt_5Ta_2Nb_2$ medium, for example, has optimum magnetic characteristics of tBr=100 G$\mu$m, Hc= 2,500 Oe, S=0.8 and S*=0.8.

The present inventors have succeeded in producing a medium having high resolution and low noise by particularly using $Co_{74}Cr_{17}Pt_5Ta_2Nb_2$ having an extremely low noise for the lower layer magnetic recording layer and $Co_{bal}\text{—}Cr_{14\text{-}23}\text{—}Pt_{1\text{-}20}\text{—}W_x\text{—}C_y$ (described above) having high resolution and restricted noise as the upper layer.

In the magnetic recording medium according to the present invention, the magnetic recording layer preferably has tBr (a product of the film thickness t of the magnetic recording layer and residual magnetization density Br) of 30 to 180 G$\mu$m irrespective of the single-layered structure or the two-layered structure. The magnetic recording layer of the single-layered structure, in particular, preferably has tBr of 50 to 180 G$\mu$m, and the magnetic recording layer of the two-layered structure preferably has tBr of 30 to 160 G$\mu$M. The magnetic recording layer according to the present invention has lower Br than conventional magnetic recording layers. Therefore, it is particularly optimal as a magneto-resistance effect head such as an MR head.

The magnetic recording layer disposed over the non-magnetic substrate through the underlayer is formed of the CoCrPtWC quinary alloy as described above, or comprises the upper layer of the CoCrPtWC quinary alloy and the lower layer of the CoCrPtTaNb quinary alloy, whenever necessary. Such magnetic recording layers can be obtained preferably and advantageously by the sputtering process under a specific film formation condition. To improve the coercive force, in particular, sputtering is preferably carried out under the application of a DC negative bias. Magnetron sputtering, for example, can be used as the sputtering process in the same way as the film formation of the underlayer. A suitable film formation condition is, for example, a film formation temperature of about 100 to about 350° C., preferably about 200 to 320° C., particularly preferably around 250° C., an Ar gas pressure of about 1 to about 10 mTorr, and a DC negative bias of about 80 to about 400 V. When the film formation temperature exceeds about 350° C., the substrate that should be originally non-magnetic is likely to exhibit magnetism. Therefore, such a film formation temperature is preferably avoided. Other film formation methods such as vacuum deposition and ion beam sputtering may be used in place of sputtering, whenever necessary. When the non-magnetic substrate is a NiP-plated aluminum substrate, a preferred example of the formation of the magnetic recording layer forms the magnetic recording layer from the alloy described above by using sputtering as the sputtering process at a film formation temperature of about 220 to about 320° C. while a DC negative bias is applied.

The magnetic recording medium according to the present invention comprises a carbonaceous protective layer of the present invention on the magnetic recording layer for protecting the latter. The carbonaceous protective layer is similar to carbon-based protective layers that are conventionally used in the field of the magnetic recording medium in view of being made from a carbonaceous material, but is distinguished from the conventional carbon-based protective layers in that the carbonaceous protective layer of the present invention is deposited by using the FCA process and that nitrogen is doped into the protective layer.

Here, the principle of the FCA process will be briefly explained. In the FCA process, an arc discharge is generated between a cathode target and an anode, and constituent target atoms and electrons are driven out. The atoms thus driven out are ionized as they impinge against electrons in the proximity of a cathode spot. Macro-particles, too, peel from the cathode spot besides the atoms and the electrons. These ions, electrons, neutral atoms and macro-particles thus generated are accelerated by the influences of an electric field and plasma, and travel towards a filter portion. A filter traps the neutral atoms and the macro-particles, so that only the ions and the electrons reach the substrate. As a result, a nitrogen-containing carbonaceous thin film originating from the arriving ions and electrons is formed on the surface of the substrate.

The present invention combines the formation of the carbonaceous thin film by the FCA process with the introduction of nitrogen. The FCA process can form a hard carbonaceous thin film, but cannot easily change film quality due to the complicated the film formation conditions. Control of film quality is essentially necessary to sufficiently satisfy the recent needs for the magnetic recording media, as has already been described, and the present invention makes it possible to control film quality by mixing nitrogen with the carbon beam. The incorporation of nitrogen into the carbonaceous thin film during its deposition by the FCA process can be advantageously carried out by irradiation with a nitrogen ion beam, application of a nitrogen atmosphere or a combination thereof. Incidentally, according to the prior art technology, mixing of nitrogen has been widely carried out when forming a carbonaceous thin film by sputtering, for example, but the effect brought forth by this method is only an improvement in hardness resulting from the strengthening of bonds.

The film formation method with nitrogen addition described above will be more easily understood from FIG. 7 which will be referred to hereinafter. That is, in the inside of a film formation chamber, a substrate is disposed. A carbon beam (ion and electron beam) from a filter portion impinges against the surface of the substrate. On the other hand, an ion gun equipped with a nitrogen gas charging pipe is disposed above the film formation chamber, and emits a nitrogen beam (containing a nitrogen gas) in such a manner as to intersect the carbon beam. The nitrogen ion beam is caused to be incident from the horizontal direction to the substrate so as to reduce damage to a magnetic recording layer formed on the substrate, but may be caused to be incident from an inclined direction, whenever necessary. When nitrogen is introduced in a nitrogen atmosphere such as a nitrogen gas flow in place of the assist by the nitrogen ion beam, nitrogen is preferably introduced from the vertical direction to the carbon ion beam so as to improve homogeneity of nitrogen in the carbonaceous layer. In addition to the function of doping nitrogen into the carbonaceous thin film, the nitrogen ion beam has the function of etching and cleaning the surface of the substrate, too. In consequence, while carbon is deposited to the surface of the substrate, nitrogen can be doped into the thin film. Through this mixing of nitrogen, the structure of the carbonaceous thin film can be changed in a way in which its adsorption function to the liquid lubricant can be improved. The mixing amount of nitrogen and, hence, the adsorption function of the carbonaceous thin film to the liquid lubricant, can be easily controlled by changing the supply amount of the nitrogen ion beam. More concretely, when the film formation is conducted with the assistance of the nitrogen ion beam, for example, the nitrogen content can be controlled through control of the power of the ion beam. When the film is formed in the nitrogen atmosphere, the nitrogen content can be controlled when the flow rate of the nitrogen gas to be introduced is regulated. Furthermore, the film thickness of the carbonaceous thin film, too, can be easily controlled when the ionization condition of carbon is changed.

The carbonaceous protective layer described above preferably has a nitrogen content within the range of 2 to 20 at %, more preferably, within the range of 4 to 15 at %. When the nitrogen content is less than 2 at %, the effect of doping with nitrogen cannot be obtained. When it exceeds 20 at %, on the contrary, the proportion of the carbon-nitrogen bonds increases, and consequently, the amount of the diamond-like bond between the carbon atoms decreases and thus film hardness and durability drops. From the aspect of superiority of the FCA film formation, the film hardness of the carbonaceous protective layer is preferably at least 18 GPa, more preferably, at least 20 GPa.

Figure 2:
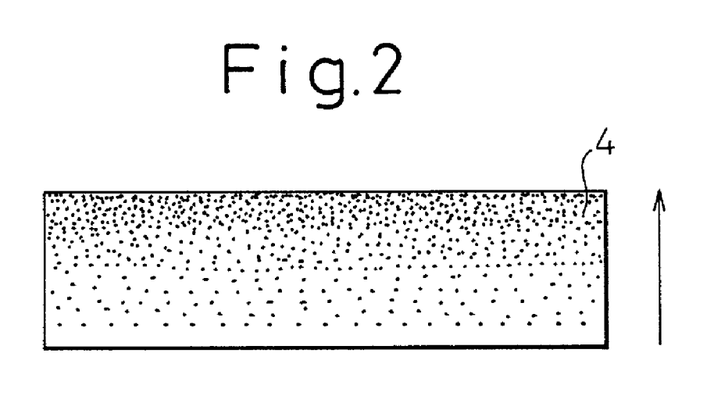
FIG. 2 is a cross-sectional view schematically showing the inclined distribution of the nitrogen in the FCA-based carbonaceous protective layer of the present invention.

Further, in the carbonaceous protective layer of the present invention, a distribution of the nitrogen concentration can be varied with different manners in the thickness-wise direction of the layer. The distribution of the nitrogen concentration is generally uniform with regard to the direction of the thickness of the carbonaceous protective layer, however, to inhibit a reduction in the layer hardness caused by addition of nitrogen, it is preferred that the amount of nitrogen added is adjusted in such a manner that the nitrogen concentration is gradually increased from a lower portion to an upper portion in the protective layer. FIG. 2 illustrates a gradual increase of the nitrogen concentration in the carbonaceous protective layer 4. For convenience, nitrogen is indicated by small black dots. As illustrated, the nitrogen concentration is gradually increased in the direction of an arrow (from a lower portion to an upper portion) in the thickness of the carbonaceous protective layer 4. As a result of such control in the nitrogen concentration in accordance with the present invention, adhesion between the carbonaceous protective layer and the liquid lubricant layer can be improved in a surface portion of the protective layer and, at the same time, with regard to the reduction of the layer hardness caused upon addition of nitrogen, the reduction can be diminished in comparison with the uncontrolled carbonaceous protective layer, i.e., the carbonaceous protective layer having uniform nitrogen concentration in the thickness-wise direction. Moreover, the above effects can be effectively amplified when nitrogen is selectively added to an upper layer portion of the carbonaceous protective layer. In other words, in one embodiment of the present invention, it is preferred that nitrogen is selectively added to the protective layer so that nitrogen is substantially not contained in the protective layer in at least the half area determined from the bottom of the protective layer, i.e., interfacial surface with the underlying layer (for example, magnetic recording layer for the magnetic recording medium).

As described above, in the carbonaceous protective layer of the present invention, its durability can be indicated by referring to a layer thickness. According to the present invention, the durability of the protective layer can be also indicated with a pin-on-disk sliding test method which will be described hereinafter. Preferably, the carbonaceous protective layer of the present invention, when its durability was evaluated with the pin-on-disk sliding test method, can ensure at least 1,000 cycles of pass rotation when the layer thickness is adjusted to 4 nm and the load of 10 gf and the support rotation speed of 20 cm/sec are applied.

Furthermore, the adsorption function of the carbonaceous protective layer to the liquid lubricant can be easily evaluated from the contact angle of the carbonaceous protective layer to water. The observation by the present inventors reveals that the contact angle of the carbonaceous protective layer to water is preferably not greater than 35 degrees when measured within 30 minutes after the film formation. When the contact angle to water exceeds 35 degrees, the adsorption function of the carbonaceous protective layer to the liquid lubricant drops, so that life of the magnetic recording medium drops drastically.

The carbonaceous protective layer can be used at various layer thicknesses that have been employed generally for the magnetic recording media. In the present invention, the function and effect of the carbonaceous protective layer can be sufficiently obtained even when the layer has a small thickness of 50 nm or less. It is particularly noteworthy that the carbonaceous protective layer of the present invention can remain highly durable for a long period of time even when its layer thickness is 5 nm or less at which the prior art technology cannot easily maintain durability. Of course, even if such a small thickness is applied, the carbonaceous protective layer can exhibit an excellent adhesion of the liquid lubricant thereto.

The carbonaceous protective layer of the present invention is generally used in the form in which a predetermined amount of nitrogen is doped into a thin film made of carbon alone. So long as the carbonaceous protective layer can be formed by the FCA process and can exhibit the intended function and effect, the carbonaceous protective layer can take any form of a layer made of carbon compounds, such as a WC layer, a SiC layer, a $B_4C$ layer and a hydrogen-containing C layer.

In addition to the essential layers and any optional layer(s) described above, the magnetic recording medium according to the present invention may further comprise additional layers that are customarily used in this technical field, or arbitrary chemical treatments may be applied to the layers contained in the magnetic recording medium. For example, a fluorocarbon resin-based lubricant layer may be coated on the carbonaceous protective layer, or other lubricating treatment may be applied. Suitable lubricants are liquid, and are easily available commercially under the trade names "Fomblin", "Kryotox", and so forth. These lubricants can prevent the trouble called a "head crash" that destroys the magnetic recording data upon contact of the head with the medium, reduce the force of friction resulting from sliding between the head and the medium, and extend the life of the medium. The thickness of the lubricant layer is generally from about 0.1 to about 0.5 nm.

The carbonaceous protective layer described above may be applied to a magnetic head, too. This is because the layer structure of the magnetic head may be fundamentally similar to that of the magnetic recording medium.

With the recent progress of information processing technologies, higher density recording has been required for magnetic disk apparatuses used as external memory devices of computers. In view of this demand, it has been recommended to use a magnetic resistance effect type head, that is, an MR head, using a magnetoresistive element the electric resistance of which changes in accordance with the intensity of a magnetic field, in place of the winding-type inductive thin film magnetic head conventionally used. The MR head uses the magnetic resistance effect, in which the electric resistance of a magnetic substance changes with an external magnetic field, to reproduction of signals on a recording medium. The MR head has as a feature that it can provide a reproduction output width far greater than that of the conventional inductive thin film magnetic heads, that it has smaller inductance and that it is expected to provide a greater S/N ratio. It is also recommended to use an AMR head utilizing an anisotropic magnetic resistance effect, a GMR head utilizing a gigantic magnetic resistance effect and a spin bulb GMR head as a practical type of the latter, in combination with the MR head.

Besides the magnetic recording medium and its production method described above, the present invention also resides in a magnetic disk apparatus using the magnetic recording medium of the present invention. The magnetic disk apparatus according to the present invention basically includes a recording head portion for recording information and a reproducing head portion for reproducing information, to and from the magnetic recording medium, though this construction is not particularly limited. The reproducing head portion, in particular, is preferably equipped with the magnetoresistive head using a magnetoresistive element the electric resistance of which changes in accordance with the intensity of a magnetic field, that is, an MR head, as will be explained below. The carbonaceous protective layer according to the present invention is assembled and utilized in the magnetic recording medium used in such a magnetic disk apparatus.

The magnetic disk apparatus according to the present invention can preferably use a composite type magnetic head in which a magnetoresistive head portion for reproducing information from a magnetic recording medium, including a magnetoresistive element and a conductor layer for supplying a sense current to the magnetoresistive element, and an inductive type recording head portion for recording information to the magnetic recording medium, having a pair of magnetic poles each formed of a thin film, the reproducing head portion and the recording head portion being laminated with each other. The magnetic resistance effect reproducing head can take various structures known in this technical field, and preferably includes an AMR head utilizing an anisotropic magnetic resistance effect and a GMR head (inclusive of a spin bulb GMR head) utilizing a gigantic magnetic resistance effect. The conductor layer of the reproducing head portion can take various structures, but is preferably of the following type:

1. as to the film thickness of the conductor layer, a conductor layer in which its portion near the magnetoresistive element is relatively thin and other portions are thick; and 2. as the film thickness and width of the conductor layer, a conductor layer in which its portion near the magnetoresistive element is relatively thin and narrow and other portions are thick and wide.

The thickness of the conductor layer, and its width, whenever necessary, can be adjusted as described above by various methods, but it is particularly recommended to increase the film thickness by employing a multi-layered structure for the conductor layer.

Particularly when the magnetic disk apparatus having the construction described above is used, it becomes possible to make the curve of the magnetic poles of the recording head portion smaller than in the conventional composite type magnetic head, to reduce the resistance of the conductor layer, and to read out information more precisely and with higher sensitivity within a small off-track range.

Figure 3:
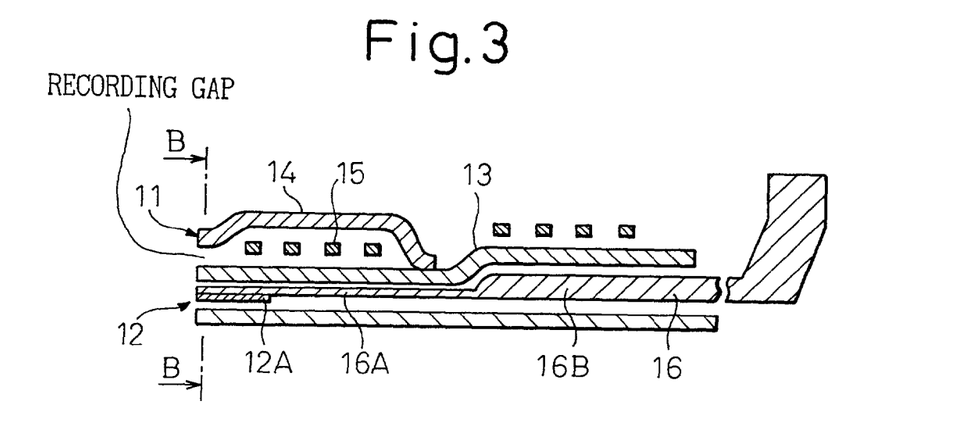
FIG. 3 is a sectional view showing the principle of a magnetic disk apparatus according to the present invention.
Figure 4:
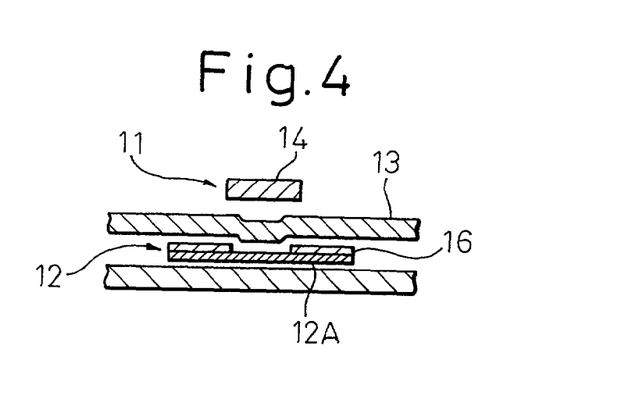
FIG. 4 is a sectional view of the magnetic disk apparatus taken along a line B—B of FIG. 3.

The magnetic disk apparatus according to the present invention preferably employs a laminate structure for its recording head portion and reproducing head portion shown in FIGS. 3 and 4. FIG. 3 shows the principle of the magnetic disk apparatus according to the present invention, and FIG. 4 is a sectional view taken along a line B—B of FIG. 3.

In FIGS. 3 and 4, reference numeral 11 denotes an induction type recording head portion for recording information to a magnetic recording medium. Reference numeral 12 denotes a magnetic resistance effect type reproducing head portion for reading out information. The recording head portion 11 comprises a lower magnetic pole (upper shield layer) 13 made of NiFe, etc, an upper magnetic pole 14 made of NiFe, etc, and opposing the lower magnetic pole 13 with a predetermined gap, and a coil 15 for exciting the magnetic poles 13 and 14 and recording information on the magnetic recording medium at the recording gap portion.

The reproducing head portion 12 is preferably constituted by the AMR head or the GMR head. A pair of conductor layers 16 for supplying a sense current to a magnetoresistive portion 12A are disposed on the magnetoresistive element 12A with a gap corresponding to a recording track width. Here, the thickness of the conductor layer 16 is thin at its portion 16A near the magnetoresistive element portion 12A and is thick at other portions 16B.

In the construction shown in FIGS. 3 and 4, the film thickness of the conductor layer 16 is small at its portion 16A near the magnetoresistive element portion 12A, and the curve of the lower magnetic pole (upper shield layer) 13 is small. Therefore, the shape of the recording gap opposing the magnetic recording medium is not greatly curved. Even when deviation exists to a certain extent between the position of the magnetic head on the track at the time of recording of information and the position of the magnetic head on the track at the time of read-out, the magnetic disk apparatus can accurately read information, and can avoid a read error even when the off-track quantity is small.

On the other hand, the film thickness of the conductor layer 16 is great at portions 16B other than near the portion 16A of the magnetoresistive element portion 12A. Therefore, the overall resistance of the conductor layer 16 can be reduced, so that the resistance change of the magnetoresistive element portion 12A can be detected with high sensitivity. In consequence, the S/N ratio can be improved. Since exothermy of the conductor layer 16 can be avoided, the occurrence of the noise resulting from exothermy can be prevented.

Figure 5:
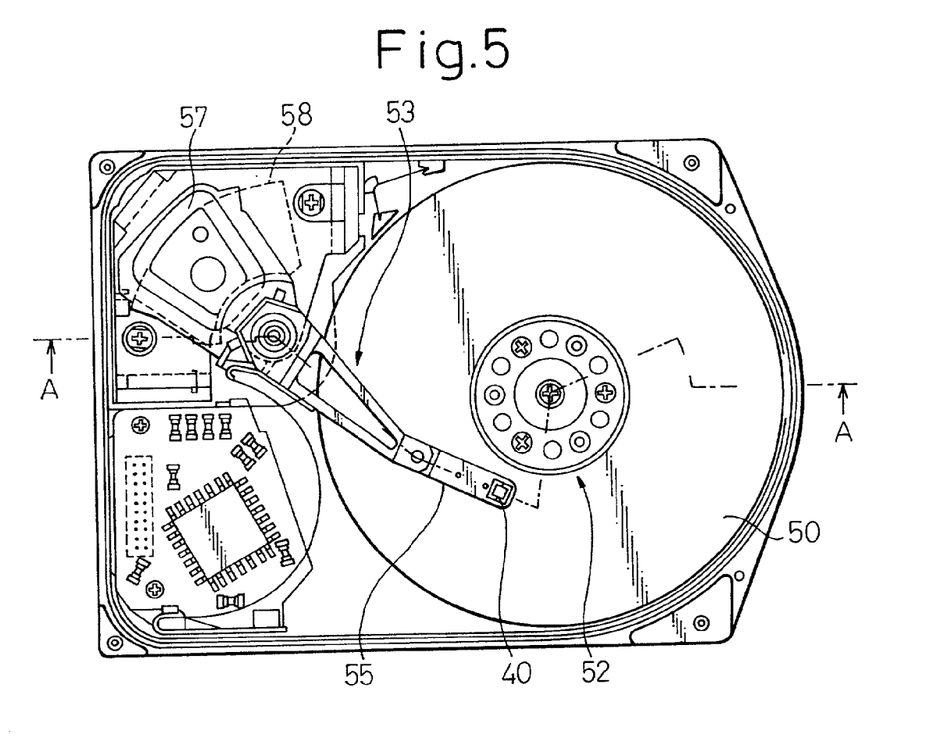
FIG. 5 is a plan view showing a preferred example of a magnetic disk apparatus according to the present invention.
Figure 6:
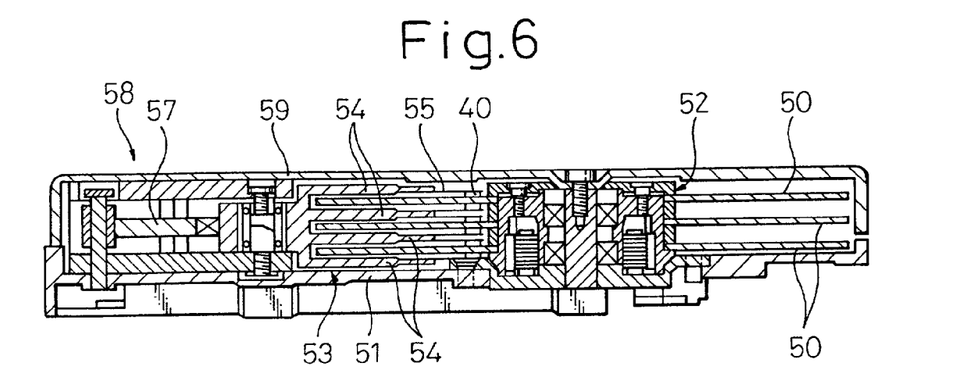
FIG. 6 is a sectional view of the magnetic disk apparatus taken along a line A—A in FIG. 5.

FIGS. 5 and 6 show a magnetic disk apparatus according to one preferred embodiment of the present invention. FIG.

5 is a plan view of the magnetic disk apparatus (with its cover is removed) and FIG. 6 is a sectional view taken along a line A—A of FIG. 5.

In these drawings, reference numeral 50 denotes a plurality of magnetic disks (three disks in the present embodiment) as the magnetic recording medium to be driven for rotation by a spindle motor 52 disposed on a base plate 51.

Reference numeral 53 denotes an actuator capable of turning and disposed on the base plate 51. A plurality of head arms 54 extending in a recording surface direction of the magnetic disk 50 are formed at one of the rotary end portions of this actuator 53. A spring arm 55 is fitted to the rotary end portion of the head arm 54. The slider 40 described above is fitted to a flexure portion of the spring arm 55 through an insulating film, not shown, in such a manner as to be capable of tilting. On the other hand, a coil 57 is fitted to the other rotary end portion of the actuator 53.

A magnetic circuit 58 comprising a magnet and a yoke is disposed on the base plate 51, and the coil 57 described above is disposed inside a magnetic gap of this magnetic circuit 58. The magnetic circuit 58 and the coil 57 together constitute a moving coil type linear motor (VCM: voice coil motor). An upper part of the base plate 51 is covered with a cover 59.

Next, the operation of the magnetic disk apparatus having the construction described above will be explained. While the magnetic disk 50 is stopped, the slider 40 is in contact with a sidetrack zone of the magnetic disk 50, and is halted.

When the magnetic disk 50 is driven and rotated at high speed by the spindle motor 52, the air stream generated by the rotation of the magnetic disk 50 causes the slider 40 to fly above the disk surface at a very small distance. When a current is caused to flow through the coil 57 under this state, a thrust develops in the coil 57 and the actuator 53 starts rotating. In consequence, the head (slider 40) can be moved onto a desired track of the magnetic disk and can read or write the data.

This magnetic disk apparatus uses the conductor layer of the magnetic head in which a portion near the magnetoresistive element portion is thin and other portions are thick. It is therefore possible to make the curve of the magnetic pole of the recording head portion small, to lower the resistance of the conductor layer, and to read out information correctly and with high sensitivity within a small off-track range.

EXAMPLES

The present invention will be further explained with reference to the examples thereof. Note, however, that the present invention should not be restricted to these examples.

Example 1

Production of Magnetic Recording Medium:

A magnetic disk having the following layer structure was produced. Note that a simple layer structure was applied to the magnetic disk for easy understanding of the present example, although the current magnetic disks generally have more complicated layer structure.

- lubricant layer
- N-doped carbonaceous protective layer
- magnetic recording layer (CoCrPtTaNb)
- underlayer ($CrMo_{10}$)
- NiP-plated aluminum substrate NiP plating was applied to an aluminum (Al) substrate to form a NiP-plated layer. The substrate surface was sufficiently washed and was subjected to texture treatment so as to sufficiently flatten the surface. A $CrMo_{10}$ (at %) underlayer, a CoCrPtTaNb magnetic recording layer, an N-doped carbon (C) protective layer and a lubricant layer comprising "Fomblin" (trade name) were laminated, in the described order, over the NiP/Al substrate by using a DC magnetron sputtering apparatus. In this Example, the inside of the sputtering chamber was exhausted to $3 \times 10^{-7}$ Torr or below before the film formation of the underlayer. While the substrate temperature was raised to 280° C., Ar gas was introduced and the sputtering chamber was held at 5 mTorr. Under this state, a −200 V bias was applied, and the film of CrMo as the underlayer was formed to a thickness of 30 nm. A CoCrPtTaNb film was formed subsequent to the formation of the underlayer so that its Brt attained 100 G$\mu$m (27 nm-thick). The target used for the film formation was a composite target prepared by disposing Pt, Ta and Nb chips on a CoCr target.

Subsequently, an N-doped carbonaceous protective layer was formed in the following way by using an FCA film formation apparatus shown in FIG. 7. The FCA film formation apparatus used in this Example comprised a film formation chamber 60, a filter portion 61 and a discharge chamber 62.

The discharge chamber 62 comprised a cathode target 74, an anode 75, a cathode coil 77 and a striker 76. The cathode coil 77 used pure graphite. As the striker 76 struck the surface of the cathode target 74, an arc discharge was started. During this discharge, the cathode coil 77 and the anode 75 reached a high temperature. Therefore, they were cooled with cooling water. The cathode coil 77 was for promoting ionization. The group of carbon particles generated inside the discharge chamber 62 took a beam form and traveled to the adjacent filter portion 61.

The filter portion 61 used a 45° bent type filter equipped with a filter coil 73. A magnetic field bent the ions and electrons of carbon, and they traveled towards the film formation chamber 60. However, neutral atoms and macroparticles could not be bent sufficiently and were trapped. A raster magnet 72 could swing the beam up and down and to right and left so that the in-plane film thickness distribution of the film could be improved.

An ion gun 67 was mounted in the film formation chamber 60, and could be used for cleaning and ion beam assist of the substrate 1 held by a substrate holder 71. An introduction gas line 66 included two piping arrangements, as shown in the drawing, could easily change over a cleaning gas and an ion assist gas. The substrate holder 71 had a rotation function and a tilting function, and could improve the in-plane film thickness distribution.

The exhaust system used a turbo-molecular pump, a dry pump and others, though not shown, and it could produce a vacuum of about $5 \times 10^{-5}$ Pa.

Figure 7:
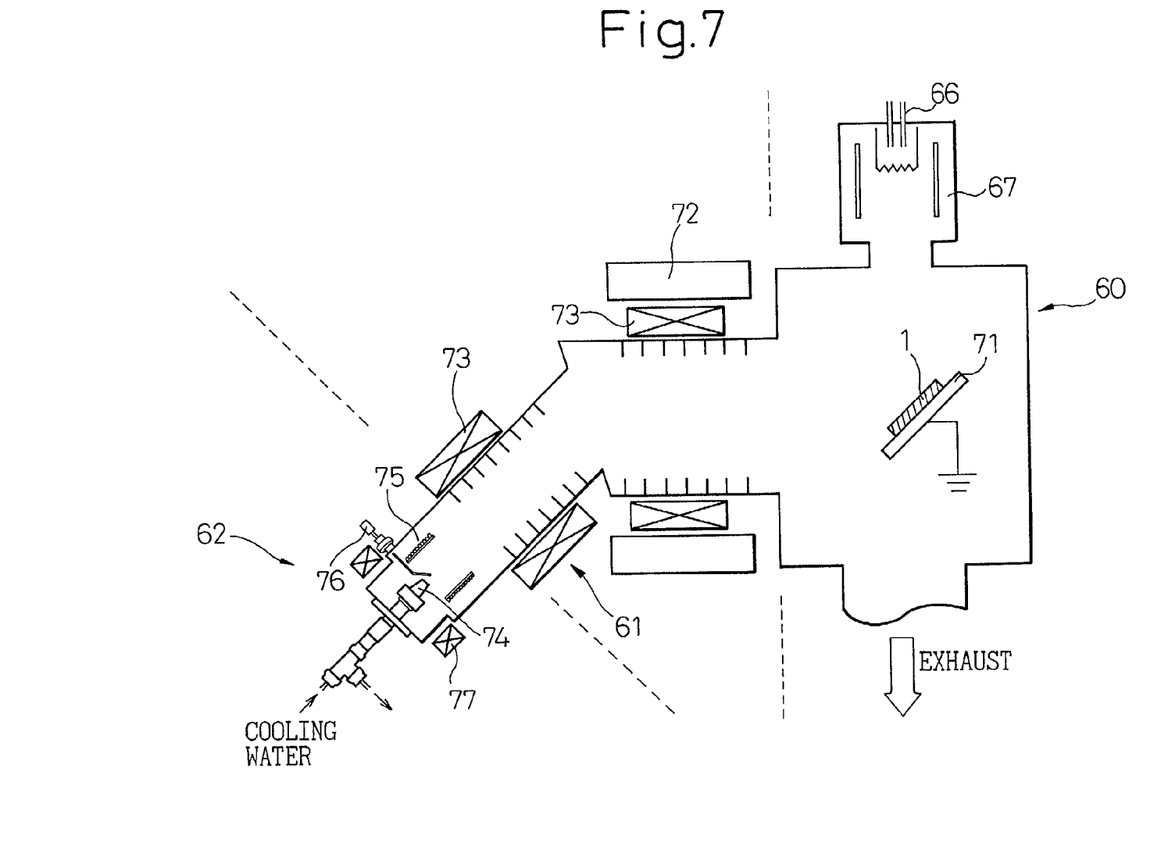
FIG. 7 is a schematic view showing the detail of the FCA film formation apparatus used in the practice of the present invention.

The N-containing carbonaceous protective layer was formed under the following film formation conditions by using the FCA film formation apparatus shown in FIG. 7. Note that the following conditions are one example, and of course, any suitable conditions can be freely selected depending upon the types and others of the FCA apparatus used.

- arc current: 80A
- cathode coil current: 10A
- filter coil current:10A, 6A
- luster coil current: X: 0A, Y: 10A

To improve film thickness distribution, the substrate was connected to the ground. When the film thickness was measured by using an optical film thickness meter "Optiprobe OP-2100" (trade name) of Serwave Co., the thickness was found to be 5 nm and its in-plane film thickness distribution was ±8%. The vacuum inside the film formation chamber depended on stability of the beam, and was within the range of about 0.8 to $4\times10^{-2}$ Pa.

Example 2

Figure 8:
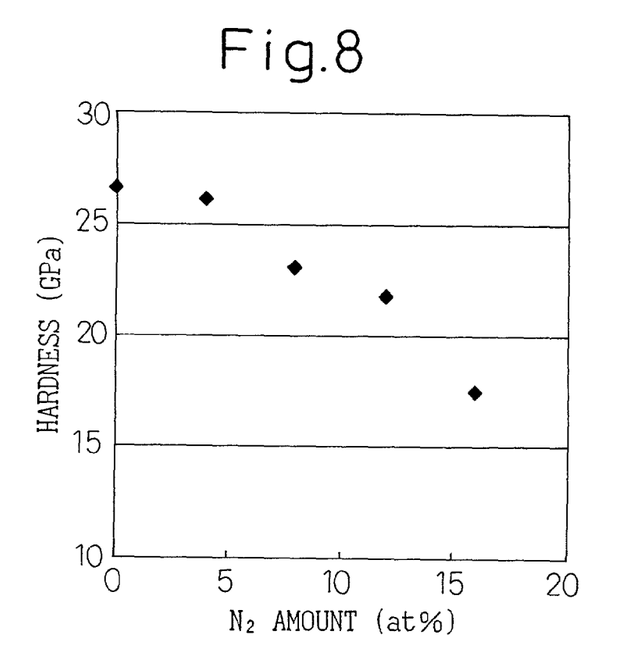
FIG. 8 is a graph plotting a change of film hardness of an FCA carbonaceous layer as a function of a nitrogen amount.

Measurement of the Film Hardness of Carbonaceous Protective Layer:

In order to evaluate how the film hardness of the carbonaceous protective layer changed depending upon the doping amount of nitrogen, an FCA carbonaceous layers were deposited to a thickness of 45 nm on a silicon wafer by the film formation method of the carbonaceous protective layer used in Example 1. The nitrogen doping amount was changed within the range of 0 to 16 at % as shown in FIG. 8. Each FCA carbonaceous protective layer was measured by using a "Nanoindenter II" (trade name) of Nanoinstruments Co. to obtain the results plotted in FIG. 8. As could be understood from this measurement results, the present invention could maintain a film hardness of at least 20 GPa even in a carbonaceous layer having a nitrogen doping amount of 12 at %. This was a noteworthy result in view of the fact that the film hardness of the carbonaceous layers formed to the same thickness by sputtering and by CVD was about 15 GPa and about 17 GPa, respectively. In other words, it could be understood that the present invention could form a carbonaceous layer having extremely high hardness. When the nitrogen doping amount was further increased, the hardness dropped, and was about 17 GPa at a nitrogen doping amount of 16 at %. This was presumably because the proportion of the carbon-nitrogen bonds increased with the increase of the nitrogen content in the layer, and the amount of the diamond-like bonds among the carbon atoms decreased.

Example 3

Measurement of Contact Angle of Carbonaceous Protective Layer:

Since the adsorption function of the carbonaceous layer to the liquid lubricant can be easily evaluated in terms of the contact angle to water on the surface of the carbonaceous layer, the change of the contact angle (wettability) of the carbonaceous protective layer to water with the passage of time depending on the nitrogen doping amount was evaluated.

Figure 9:
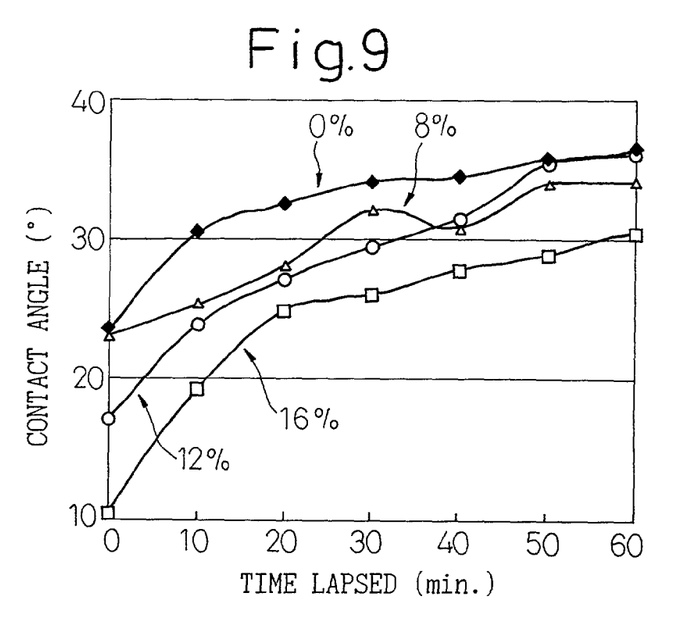
FIG. 9 is a graph plotting a change of a contact angle of an FCA carbonaceous layer to water as a function of a nitrogen amount and a time lapsed.

FCA carbonaceous layers were deposited to a thickness of 5 nm on an aluminum substrate by the film formation method of the carbonaceous protective layer described in Example 1. The nitrogen doping amount was changed within the range of 0 to 16 at % as shown in FIG. 9. The contact angle of each FCA carbonaceous layer to water was measured every 10 minutes for 60 minutes immediately after the film formation. The measurement of the contact angle was conducted in accordance with the guidelines described in Japanese Industrial Standard, JIS K6800.

FIG. 9 is a graph obtained by plotting the measurement results of the contact angle obtained in the way described above as a function of the time lapsed. As could be understood from this graph, the nitrogen-containing carbonaceous layers exhibited a decrease in the contact angle in comparison with the layers not containing nitrogen, and the decrease of the contact angle became remarkable with the increase of the nitrogen content. Such a decrease of the contact angle was remarkable immediately after the film formation in the respective carbonaceous layers. It could be expected from this result that when the nitrogen was added, surface energy of the carbonaceous layer increased and its adsorption function to the liquid lubricant could be improved.

Example 4

Production of Magnetic Recording Medium and Evaluation of Carbonaceous Protective Layer:

A magnetic disk was produced in accordance with the manner described in Example 1, and a nitrogen-doped carbonaceous layer was formed in an FCA film formation apparatus shown in FIG. 7. However, in this example, in place of application of an uniform distribution of nitrogen concentration to the carbonaceous layer, a nitrogen concentration was gradually increased from a bottom to a top surface in the carbonaceous layer with the control of the film formation conditions. For this example, since an ion beam assist method was used as a nitrogen doping means, the nitrogen concentration was inclined with control of the irradiation amount of the nitrogen ion beam. In the formation of the carbonaceous layer, in an initial stage thereof, no nitrogen ion beam was irradiated to the aluminum substrate. In the middle stage of the carbon deposition, irradiation of the nitrogen ion beam was started. As a result, in the resulting carbonaceous layer, a lower nitrogen concentration was obtained in a lower portion of the layer, while a higher nitrogen concentration was obtained in an upper portion of the layer. Such a inclined distribution of the nitrogen concentration was confirmed with a thickness-wise analysis of the carbonaceous layer using a X-ray photoelectric spectrometry.

Next, to evaluate an effect of the inclined nitrogen concentration on an adhesion of the liquid lubricant to a surface of the carbonaceous layer, a contact angle of the carbonaceous layer was measured in accordance with the manner described in Example 3.

FCA carbonaceous layers were deposited to a thickness of 5 nm on an aluminum substrate, while controlling the irradiation amount of the nitrogen ion beam as described above. The nitrogen concentration was confirmed to be 8 at % at a surface portion of the carbonaceous layer. For the comparison purpose, the above procedure was repeated for no addition of nitrogen (0 at %) and for uniform distribution of nitrogen concentration (8 at %). For each of the FCA carbonaceous layers, the contact angle of the carbonaceous layer to water was periodically measured from immediately after starting of the film formation to 360 minutes lapsed. The measurement of the contact angle was conducted in accordance with the guideline described in JIS K6800.

Figure 10:
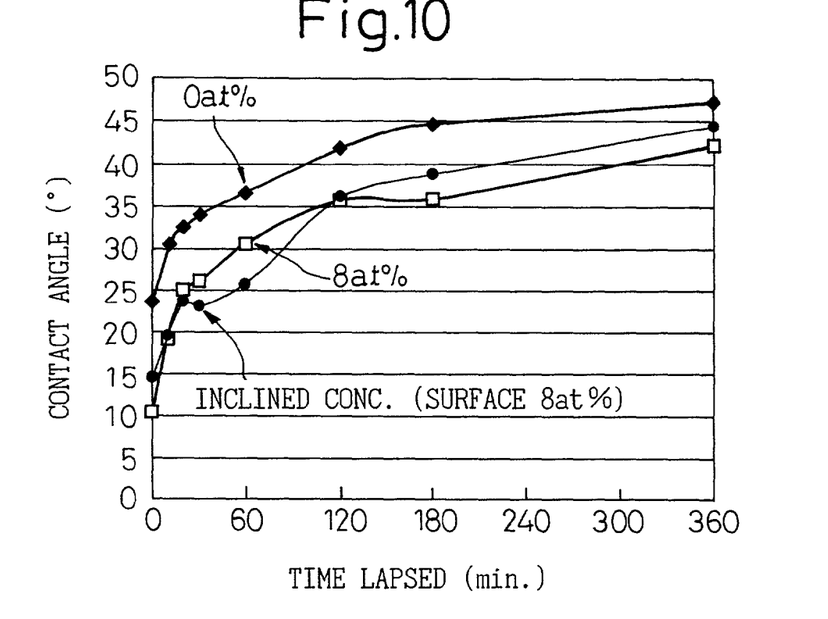
FIG. 10 is a graph plotting a change of a contact angle of an FCA carbonaceous layer to water as a function of a distribution of nitrogen concentration and a time lapsed.

FIG. 10 is a graph obtained by plotting the measurement results of the contact angle obtained in the way described above as a function of the time lapsed. As can be understood from this graph, the nitrogen-containing carbonaceous layers exhibited a decrease in the contact angle in comparison with the carbonaceous layers not containing nitrogen. Further, in the comparison of the carbonaceous layers having a uniform nitrogen concentration with the carbonaceous layers having an inclined nitrogen concentration, both types of the carbonaceous layers exhibited substantially same contact angles. That is, it is appreciated in the carbonaceous layers having an inclined nitrogen concentration that satisfactory adsorption of the liquid lubricant can be obtained as a result of surface modification of the layer.

Following the measurement of the contact angle, a durability of the carbonaceous layer was measured with a pin-on-disk sliding test method. The following magnetic disks having different carbonaceous layers were produced.

Magnetic Disk A:

The carbonaceous layer was deposited by a FCA method to obtain a uniform distribution of nitrogen concentration (8 at %). The thickness of the carbonaceous layer is 2 nm or 4 nm.

Magnetic Disk B:

The carbonaceous layer was deposited by a FCA method to obtain an inclined distribution of nitrogen concentration (8 at % at a surface portion). The thickness of the carbonaceous layer was 2 nm or 4 nm.

Magnetic Disk C (Comparative):

The carbonaceous layer is a prior art DLC (diamond-like carbon) layer. The thickness of the DLC layer is 3 nm, 4 nm, 5 nm or 6 nm.

Figure 11:
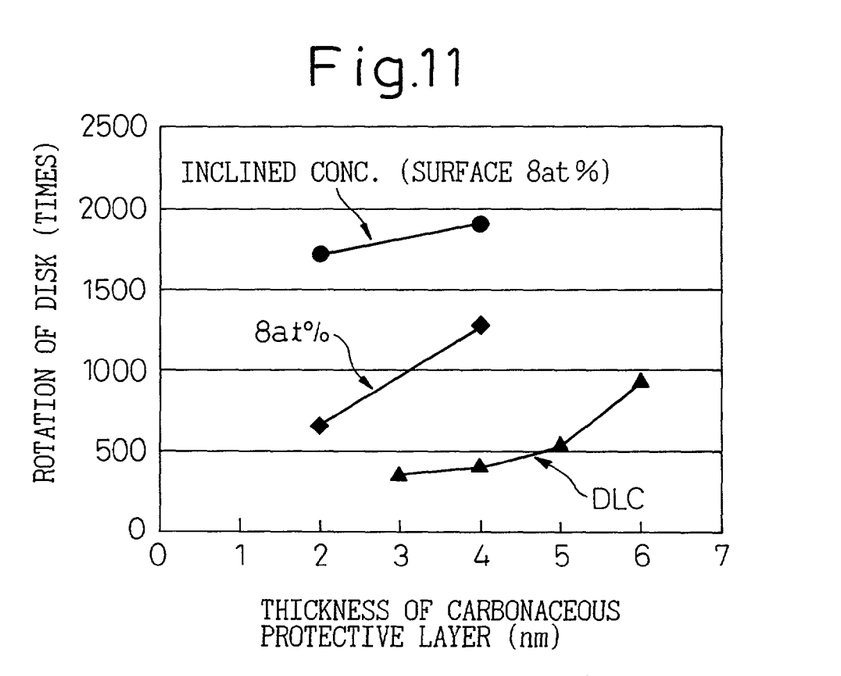
FIG. 11 is a graph plotting a durability of an FCA carbonaceous layer as a function of a distribution of nitrogen concentration and a layer thickness.

A spherical pin (diameter 2 mm) of $Al_2O_3$-TiC was applied with a load of 10 gf on a surface of each magnetic disk, and the magnetic disk was rotated at a linear speed of 20 cm/sec. The rotation of the disk was stopped when a breakage was observed in a surface of the carbonaceous layer, and cycles (number) of rotations observed at the breakage were recorded to obtain the measurement results plotted in FIG. 11. As can be understood from this graph, when nitrogen is added to the carbonaceous layer according to the present invention, remarkably excellent durability can be obtained even if the small thickness was used, in comparison with the prior art DLC layer. Particularly, when the nitrogen concentration was inclined in the carbonaceous layer, an improvement of the durability can be amplified, along with reduction of the variation of the durability which is caused with a variation of the layer thickness. In other words, the inclined nitrogen concentration can improve the inhibition effect to the reduction of durability caused due to nitrogen addition.

Subsequently, the above procedure was repeated by adding nitrogen, through application of a nitrogen atmosphere in place of the ion beam assist method, in the formation of the nitrogen-doped carbonaceous layers in the FCA film formation apparatus. The nitrogen concentration of the carbonaceous layers was controlled by changing a flow rate of the nitrogen gas introduced into the apparatus. The resulting carbonaceous layers having the inclined nitrogen concentration exhibited excellent durability and lubricant adhesion comparable to the above results obtained with application of the ion beam assist method.

Effects of the Present Invention:

As described above, according to the present invention, since the carbonaceous protective layer is formed by using the FCA process, it becomes possible to obtain a carbonaceous protective layer capable of keeping its excellent durability for an extended period, and also to provide a magnetic recording medium that has a high performance and a long service life.

Further, according to the present invention, since the carbonaceous layer is doped with nitrogen through the film formation method including the nitrogen ion beam assist or presence of the nitrogen atmosphere, it becomes possible to control the layer hardness and the adsorption of a lubricant. Accordingly, even when the film thickness is 5 nm or less, the carbonaceous layer can exhibit excellent durability.

Furthermore, since a nitrogen concentration can be inclined in the formation of the carbonaceous layer, an adhesion of the liquid lubricant to a surface portion of the carbonaceous layer can be improved, along with inhibition of the reduction of the layer hardness caused due to addition of nitrogen.

Moreover, when the magnetic recording medium according to the present invention is used for hard disk apparatuses of computers such as magnetic disk apparatuses, they can sufficiently satisfy the recent high-level needs (for information recording and read-out with high-density recording, with high sensitivity and at a high speed).

What is claimed is:

1. A carbonaceous protective layer having a controlled hardness of at least 18 GPa and a controlled adsorption of a liquid lubricant evaluated from a contact angle to water of not greater than 35° for protecting an underlying material, which is a layer formed by a nitrogen ion beam-assisted Filtered Cathodic Arc process, and contains nitrogen distributed therein.

2. A carbonaceous protective layer according to claim 1, wherein nitrogen is not contained in a substantially lower half portion, occupying substantially one half of the thickness-wise distance from a bottom surface of said carbonaceous protective layer, and wherein a nitrogen concentration is gradually increased from substantially one half of the thickness-wise distance from a bottom surface of said carbonaceous protective layer to a top surface side in said carbonaceous protective layer.

3. A carbonaceous protective layer according to claim 1 or 2, wherein a nitrogen content of said carbonaceous protective layer is 2 to 20 at %.

4. A carbonaceous protective layer according to claim 1 or 2, wherein said carbonaceous protective layer is positioned over a magnetic recording layer of the magnetic recording medium.

5. A magnetic disk apparatus according to claim 1, wherein nitrogen is distributed in an inclined concentration in said carbonaceous protective layer, and a nitrogen concentration is gradually increased from a bottom surface side to a top surface side in said carbonaceous protective layer.

6. A magnetic recording medium comprising a nonmagnetic substrate having applied thereon a magnetic recording layer, in which said magnetic recording layer has a carbonaceous protective layer having a controlled hardness of at least 18 GPa and a controlled adsorption of a liquid lubricant evaluated from a contact angle to water of not greater than 35° formed thereon by a nitrogen ion beam-assisted Filtered Cathodic Arc process, and said carbonaceous protective layer contains nitrogen distributed therein.

7. A magnetic recording medium according to claim 6, wherein nitrogen is substantially not contained in a lower half portion, occupying substantially one half of the thickness-wise distance from a bottom surface of said carbonaceous protective layer.

8. A magnetic recording medium according to claim 6 or 7, wherein a nitrogen content of said carbonaceous protective layer is 2 to 20 at %.

9. A magnetic recording medium according to claim 6, wherein nitrogen is distributed in an inclined concentration in said carbonaceous protective layer, and a nitrogen concentration is gradually increased from a bottom surface side to a top surface side in said carbonaceous protective layer.

10. A magnetic disk apparatus comprising a recording head for recording information and a reproducing head for reproducing information to and from a magnetic recording medium, in which said magnetic recording medium comprises a non-magnetic substrate having applied thereon a magnetic recording layer, and said magnetic recording layer has a carbonaceous protective layer having a controlled hardness of at least 18 GPa and a controlled adsorption of a liquid lubricant evaluated from a contact angle to water of not greater than 35°, formed thereon by a nitrogen ion beam-assisted Filtered Cathodic Arc process, which contains nitrogen distributed therein.

11. A magnetic disk apparatus according to claim 10, wherein nitrogen is substantially not contained in a lower half portion, occupying a substantially one half of the thickness-wise distance from a bottom surface of said carbonaceous protective layer, and wherein a nitrogen concentration is gradually increased from substantially one half of the thickness-wise distance from a bottom surface of said carbonaceous protective layer to a top surface side in said carbonaceous protective layer.

12. A magnetic disk apparatus according to claim 10, wherein nitrogen is distributed in an inclined concentration in said carbonaceous protective layer, and a nitrogen concentration is gradually increased from a bottom surface side to a top surface side in said carbonaceous protective layer.

* * * * *